United States Patent
Lee et al.

(10) Patent No.: US 9,623,503 B2
(45) Date of Patent: Apr. 18, 2017

(54) SUPPORT UNIT AND SUBSTRATE TREATING DEVICE INCLUDING THE SAME

(71) Applicant: SEMES CO., LTD., Chungcheongnam-do (KR)

(72) Inventors: Wonhaeng Lee, Chungcheongnam-do (KR); Kangrae Ha, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 302 days.

(21) Appl. No.: 14/527,606

(22) Filed: Oct. 29, 2014

(65) Prior Publication Data
US 2015/0116689 A1    Apr. 30, 2015

(30) Foreign Application Priority Data
Oct. 31, 2013 (KR) .......... 10-2013-0131350
Jan. 24, 2014 (KR) .......... 10-2014-0009050

(51) Int. Cl.
| | | |
|---|---|---|
| C03C 25/68 | (2006.01) | |
| G03B 27/58 | (2006.01) | |
| H01L 21/683 | (2006.01) | |
| B23K 1/00 | (2006.01) | |
| H01L 21/67 | (2006.01) | |
| H01L 21/687 | (2006.01) | |

(Continued)

(52) U.S. Cl.
CPC ...... *B23K 1/0016* (2013.01); *H01J 37/32082* (2013.01); *H01J 37/32715* (2013.01); *H01L 21/67063* (2013.01); *H01L 21/67069* (2013.01); *H01L 21/67109* (2013.01); *H01L 21/6831* (2013.01); *H01L 21/6833* (2013.01); *H01L 21/68757* (2013.01); *G03F 7/70708* (2013.01)

(58) Field of Classification Search
CPC .......... B23K 1/0016; G03F 7/70708; H01J 37/32082; H01J 37/32715; H01L 21/3065; H01L 21/67063; H01L 21/67069; H01L 21/67109; H01L 21/6831; H01L 21/6833; H01L 21/68757
USPC ......... 156/345.51; 216/67; 355/72; 361/234; 438/710
See application file for complete search history.

(56) References Cited

U.S. PATENT DOCUMENTS

| | | | | |
|---|---|---|---|---|
| 6,120,661 A | * | 9/2000 | Hirano | C03C 15/00 118/723 R |
| 6,280,584 B1 | * | 8/2001 | Kumar | H02N 13/00 118/666 |

(Continued)

FOREIGN PATENT DOCUMENTS

| | | |
|---|---|---|
| CN | 102421725 A | 4/2012 |
| JP | H1032239 A | 2/1998 |

(Continued)

*Primary Examiner* — Colin Kreutzer
(74) *Attorney, Agent, or Firm* — Carter, DeLuca, Farrell & Schmidt, LLP

(57) ABSTRACT

Provided is a method of manufacturing a support unit that supports a substrate. The method includes: providing a support plate formed of a non-conductive material and supporting a substrate; providing a base plate disposed below the support plate and formed of a material including a conductive material; and depositing a metallic layer at a bottom of the support plate and coupling the metallic layer and the base plate through brazing.

21 Claims, 5 Drawing Sheets

(51) Int. Cl.
*H01J 37/32* (2006.01)
*G03F 7/20* (2006.01)

(56) References Cited

U.S. PATENT DOCUMENTS

| | | | | |
|---|---|---|---|---|
| 6,483,690 | B1* | 11/2002 | Nakajima | H01L 21/6833 |
| | | | | 361/234 |
| 2005/0118450 | A1* | 6/2005 | Fujii | B23K 35/0233 |
| | | | | 428/621 |
| 2007/0199660 | A1* | 8/2007 | Yokoyama | C23C 16/4581 |
| | | | | 156/345.51 |
| 2009/0308538 | A1* | 12/2009 | Yonekura | C23C 16/4581 |
| | | | | 156/345.51 |

FOREIGN PATENT DOCUMENTS

| | | |
|---|---|---|
| JP | 2002164425 A | 6/2002 |
| JP | 2005057231 A | 3/2005 |
| KR | 1020000032369 A | 6/2000 |
| KR | 10-0945270 A | 2/2010 |
| KR | 20100103611 A | 9/2010 |

\* cited by examiner

SUPPORT UNIT AND SUBSTRATE TREATING DEVICE INCLUDING THE SAME

CROSS-REFERENCE TO RELATED APPLICATIONS

This U.S. non-provisional patent application claims priority under 35 U.S.C. §119 of Korean Patent Application Nos. 10-2013-0131350, filed on Oct. 31, 2013, and 10-2014-0009050, filed on Jan. 24, 2014, the entire contents of which are hereby incorporated by reference.

BACKGROUND OF THE INVENTION

The present invention disclosed herein relates to a substrate treating device, and more particularly, to a substrate treating device using plasma.

In order to manufacture a semiconductor device, various processes such as photolithography, etching, ashing, ion implantation, thin film deposition, and cleaning are performed on a substrate to form a desired pattern thereon. Among processes, an etching process is a process for removing a selected area from a layer formed on a substrate through wet etching or dry etching.

For the dry etching, an etching device using plasma is used. In general, in order to form plasma, an electromagnetic field is formed in an inner space of a chamber and excites a process gas provided to the chamber to a plasma state.

The plasma refers to an ionized gas state formed of ions or electrons and radicals. The plasma is generated by very high temperatures, strong electric fields, or RF electromagnetic fields. A semiconductor device manufacturing process performs an etching process by using plasma. An etching process is performed as ion particles contained in plasma collide with a substrate.

Typically, an electrostatic chuck includes a support plate and a metallic body. The support plate and the body adhere to each other by an organic bonder such as silicon or acrylic. However, silicon has excellent heat resistance but low thermal resistance. Accordingly, silicon is not damaged by a heat occurring during a substrate treating process but does not effectively block heat transfer between the body and the support plate. Acrylic has excellent thermal resistance but low heat resistance. Acrylic prevents heat loss between the support plate and the body but is damaged by heat occurring during a substrate treating process.

In such a way, in relation to a currently used organic bonder, the life span is reduced and the process temperature rise is limited due to the non-uniform temperature occurrence in an electrostatic chuck resulting from thermal durability deterioration.

SUMMARY OF THE INVENTION

The present invention provides a method of manufacturing a support unit having excellent thermal durability in an electrostatic chuck used during a substrate treating process and a substrate treating device including the support unit.

Embodiments of the present invention provide methods of manufacturing a support unit that supports a substrate. The methods include: providing a support plate formed of a non-conductive material and supporting a substrate; providing a base plate disposed below the support plate and formed of a material including a conductive material; and depositing a metallic layer at a bottom of the support plate and coupling the metallic layer and the base plate through brazing.

In some embodiments, the methods may further include providing a filler of a metallic material between the support plate and the base plate to couple the support plate and the base plate by using the filler as a medium.

In other embodiments, the base plate may be formed of a conductive composite material obtained by mixing the conductive material and an added material to minimize a heat stress due to a thermal expansion rate difference between the base plate and the support plate.

In still other embodiments, the conductive material may include Ti or Al and the added material may include one of SiC, $Al_2O_3$, Si, graphite, and glass fiber.

In even other embodiments, the added material may have a thermal expansion rate less than a thermal expansion rate difference between the conductive material and a material of the support plate.

In yet other embodiments, the conductive composite material may include the added material of 10% to 70%.

In further embodiments, the metallic layer may be deposited to the bottom of the support plate through vacuum deposition or plating.

In still further embodiments, an uneven part may be provided to minimize a stress due to a thermal expansion of a bottom of the metallic layer or a top surface form of the base plate.

In even further embodiments, the metallic layer may include one of Ti, Ni, and Ag.

In yet further embodiments, the filler may include Al.

In yet further embodiments, a metallic mesh buffering a thermal expansion at high temperature may be provided in the filler.

In yet further embodiments, the metallic mesh may have a porosity of 20% to 80%.

In other embodiments of the present invention, substrate support units include: a support plate including an electrode that adsorbs a substrate by electrostatic force and having a bottom where a metallic layer is deposited; and a base plate disposed below the support plate, connected to a high frequency power, and coupled to the metallic layer through brazing.

In some embodiments, an even part may be provided to minimize a stress due to a thermal expansion of a bottom of the metallic layer, a top surface of the base plate, or a form of a metallic deposition layer and the uneven part may be provided in a mesh form or an embossing form.

In other embodiments, the base plate may include a conductive composite material obtained by adding one of SiC, $Al_2O_3$, Si, graphite, and glass fiber to a conductive material to minimize a heat stress due to a thermal expansion rate difference between the base plate and the support plate.

In still other embodiments, the substrate support units may further include a bonding part disposed between the metallic layer and the base plate and fixing the metallic layer and the base plate by using a filler as a medium.

In even other embodiments, the bonding part may further include a metallic mesh therein.

In still other embodiments of the present invention, substrate treating devices include: a chamber having a treating space therein; a support unit disposed in the chamber and supporting a substrate; a gas supply unit supplying a process gas to the treating space; and a plasma source generating plasma from the process gas, wherein the support unit includes: a support plate including an electrode that adsorbs a substrate by electrostatic force and having a bottom where a metallic layer is deposited; and a base plate provided below the support plate and connected to a high frequency power; and a metallic filler disposed between the support plate and the base plate and bonding the support plate and the base plate by brazing.

In some embodiments, the base plate may include a conductive composite material obtained by adding one of Sic, $Al_2O_3$, Si, graphite, and glass fiber to a conductive material to minimize a heat stress due to a thermal expansion rate difference between the base plate and the support plate.

In other embodiments, the filler may further include a metallic mesh therein.

In still other embodiments, the filler may be provided in a metallic mesh form.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Figure 1:
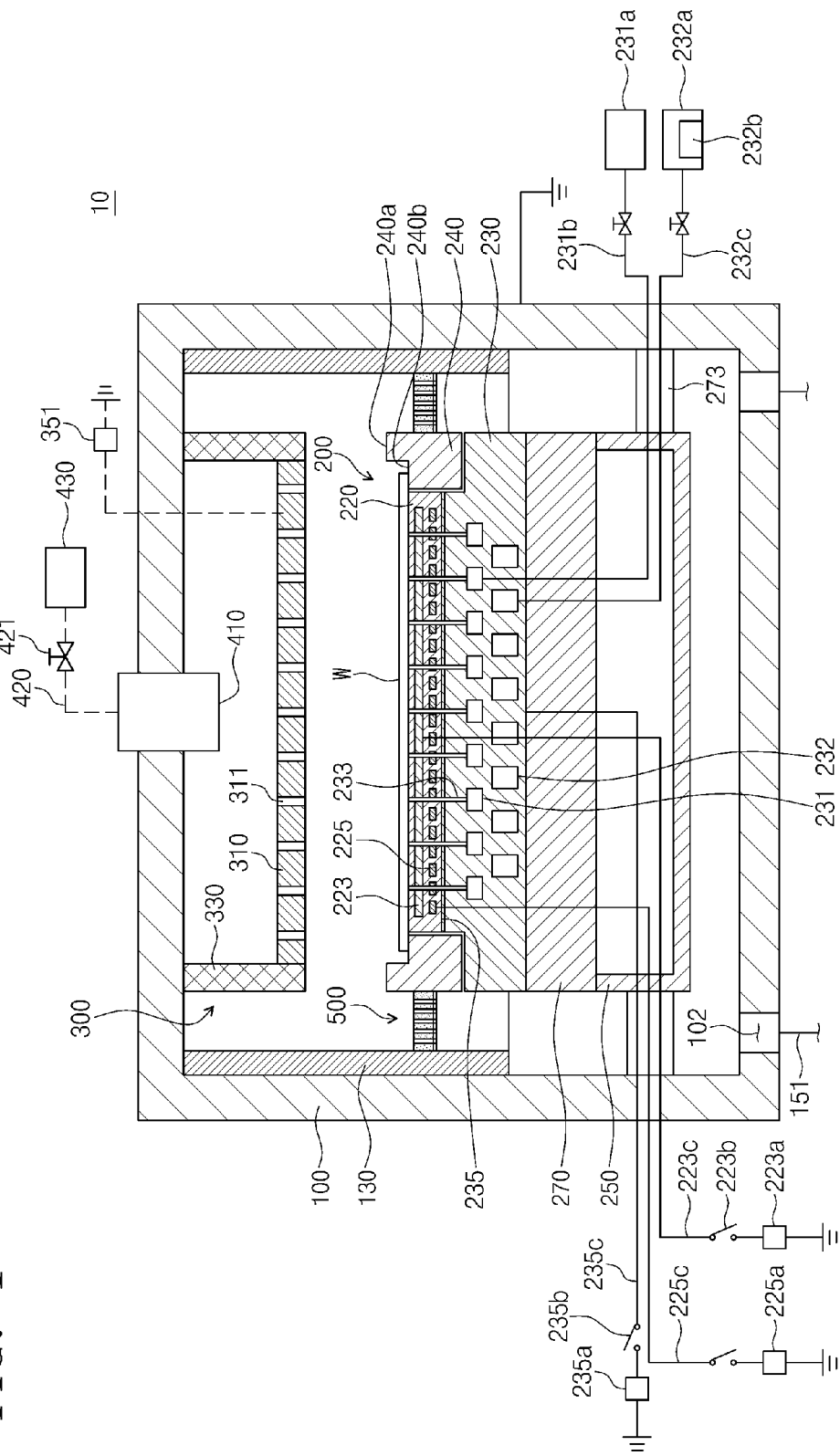
FIG. 1 is a sectional view illustrating a substrate treating device according to an embodiment of the present invention.

FIG. 1 is a sectional view illustrating a substrate treating device according to an embodiment of the present invention.

Referring to FIG. 1, the substrate treating device 10 treats a substrate W by using plasma. For example, the substrate treating device 10 may perform a process such as etching, cleaning, and ashing on the substrate W by using plasma. The substrate treating device 10 includes a chamber 100, a support unit 200, a plasma source 300, a gas supply unit 400, and a baffle unit 500.

The chamber 100 provides a treatment space therein where a substrate treating process is performed. The chamber 100 has a treatment space in a closed shape therein. The chamber 100 is provided with a metallic material. The chamber 100 may be provided with an aluminum material. The chamber 100 may be grounded. A discharge hole 102 is formed in the bottom surface of the chamber 100. The discharge hole 102 is connected to a discharge line 151.

Reaction by-products occurring during a manufacturing process and gas staying in an inner space of a chamber may be discharged to the outside through the discharge line 151. The inside of the chamber 100 is reduced to a predetermined pressure by a discharge process.

According to an embodiment of the present invention, a liner 130 may be provided to the inside of the chamber 100. The liner 130 has a cylindrical form with the top and bottom surfaces open. The chamber 100 may be provided to contact the inner surface of the chamber 100. The liner 130 protects the inner wall of the chamber 100 as so to prevent it from being damaged by arc discharge. Additionally, the liner 130 also prevents impurities occurring during a substrate treating process from being deposited on the inner wall of the chamber 100. Selectively, the liner 130 may not be provided.

The support unit 200 is disposed inside the chamber 100. The support unit 200 supports the substrate W. The support unit 200 may include an electrostatic chuck 210 adsorbing the substrate W by using an electrostatic force. Unlike this, the support unit 200 may support the substrate W through various methods such as mechanical clamping. Hereinafter, the support unit 200 including the electrostatic chuck 210 will be described.

The support unit 200 includes the electrostatic chuck 210, a lower cover 250, and a plate 270. The support unit 200 may be disposed spaced from the bottom surface of the chamber 100 to the top in the chamber 100.

The electrostatic chuck 210 includes a support plate 220 and a base plate 230.

The support plate 220 is provided to the top end part of the electrostatic chuck 210.

Figure 2:
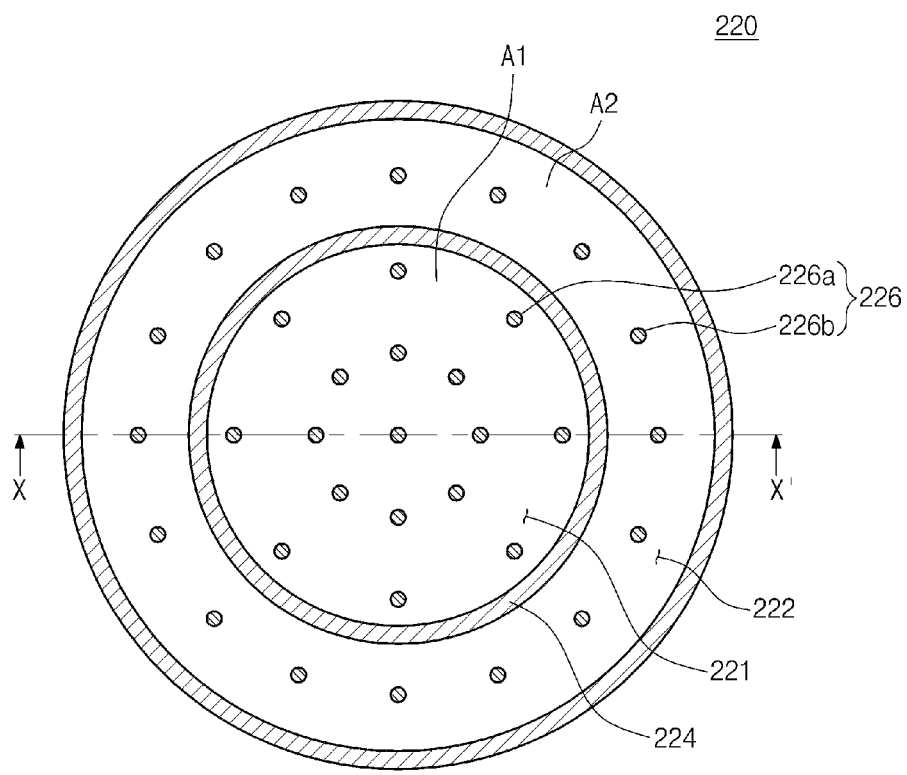
FIG. 2 is a plan view illustrating a support plate of a support unit of FIG. 1 according to an embodiment of the present invention.

The support plate 220 is formed of a non-conductive material. A metallic layer 226 is deposited at the bottom surface of the support plate 220. Unlike this, the support plate 220 may be provided with a mixed material of a conductive material included in the material of the base plate 230 and an added material. According to an embodiment of the present invention, the support plate 220 may include a disc-shaped dielectric substance. The substrate W is disposed at the top surface of the support plate 220. The top surface of the support plate 220 has a smaller radius than the substrate W. Due to this, the edge heating area of the substrate W is disposed at the outer side of the support plate 220. A first supply passage 221 shown in FIG. 2 is formed at the top surface of the support plate 220. A plurality of first supply passages 221 are formed spaced from each other and are provided as a path through which a heat transfer medium is supplied to the bottom surface of the substrate W.

Figure 3:
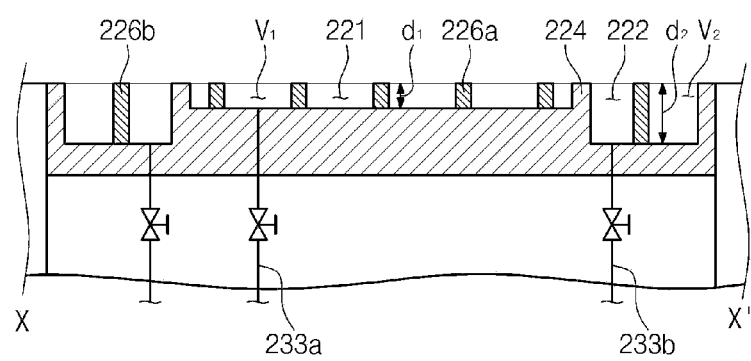
FIG. 3 is a sectional view illustrating a support plate of a support unit, taken along a line X-X' of FIG. 2.

FIG. 2 is a plan view of a support plate according to an embodiment of the present invention. FIG. 3 is a sectional view illustrating a support plate of a support unit, taken along a line X-X' of FIG. 2.

Referring to FIGS. 2 and 3, the support plate 220 includes an inner groove 221, an external groove 222, a protrusion 224, a projection part 226, and a second supply passage 233. The inner groove 221 may be disposed at the top center part of the support plate 220. As seen from the top, the inner groove 221 may be provided in a circular form. The inner groove 221 may be provided to have a first depth d1.

Additionally, the inner groove 221 may be provided to have a first area A1, as seen from the top. The inner groove 221 may be provided with a first volume V1. At this point, the first volume V1 means a volume where a heat transfer gas is disposed in the inner groove 221. Accordingly, the first volume V1 means a volume obtained by excluding the volume of the protrusion part 226 in the inner groove 221 from the volume of the inner groove 221.

As seen from the top, the outer groove 222 may be provided in an annular ring form. The outer groove 222 may be provided in a form surrounding the inner groove 221. The outer groove 222 may be provided to have a second depth d2. At this point, the second depth d2 of the outer groove 222 may be different from the first depth d1 of the inner groove 221. Unlike this, the second depth d2 of the outer groove 222 may be identical to the first depth d1 of the inner groove 221.

As seen from the top, the outer groove 222 may be provided to have a second area A2. The second area A2 of the external groove 222 may be broader than the first area A1 of the inner groove 221. Unlike this, the second area A2 of the external groove 222 may be identical to the first area A1 of the inner groove 221. The outer groove 222 may be provided with a second volume V2. At this point, the second volume V2 means a volume where a heat transfer gas is disposed in the outer groove 222. Accordingly, the second volume V2 means a volume obtained by excluding the volume of the protrusion part 226 in the outer groove 222 from the volume of the outer groove 222. According to an embodiment of the present invention, the second volume V2 of the external groove 222 may be greater than the first volume V1 of the inner groove 221. Unlike this, the second volume V2 of the external groove 222 may be identical to the first volume V1 of the inner groove 221.

The protrusion 224 may be provided between the inner groove 221 and the outer groove 222. The protrusion 224 may be provided as a boundary for distinguishing the inner groove 221 from the outer groove 222. The top end height of the protrusion 224 may be identical to the top end height of the protrusion part 226.

The protrusion part 226 is provided in the inner groove 221 and the outer groove 222. The protrusion part 226 may be provided in plurality. The protrusion part 226 may include a first protrusion part 226a and a second protrusion part 226b. The first protrusion part 226a may be disposed in the inner groove 221. The first protrusion part 226a may be provided in plurality. The plurality of first protrusion parts 226a may be disposed at regular intervals. The first protrusion part 226a may have a depth identical to the first depth d1 of the inner groove 221. The top end height of the first protrusion part 226a may be identical to the top end height of the protrusion 224.

The second protrusion part 226b may be disposed in the outer groove 222. The second protrusion part 226b may be provided in plurality. The plurality of second protrusion parts 226b may be disposed at regular intervals. The second protrusion part 226b may have a depth identical to the second depth d2 of the outer groove 222. The top end height of the second protrusion part 226b may be identical to the top end height of the protrusion 224.

The second supply passage 233 supplies a heat transfer gas to the bottom of the substrate W. The second supply passage 233 may supply a heat transfer gas to each of the inner groove 221 and the outer groove 222. The second supply passage 233 may be connected to each of the inner groove 221 and the outer groove 222. For example, the second supply passage 233 may include an inner second supply passage 233a and an outer second supply passage 233b. The inner second supply passage 233a is connected to the inner groove 221 to deliver a heat transfer gas to the inner groove 221. The outer second supply passage 233b is connected to the outer groove 222 to deliver a heat transfer gas to the outer groove 222.

The heat transfer gas serves as a heat transfer medium between the substrate W and the support unit 200. The heat transfer gas provides a fluid having great thermal conductivity so that heat is transferred easily between the substrate W and the support unit 200. Accordingly, the temperature of the substrate W may be adjusted by adjusting the amount of a heat transfer gas provided at the top surface of the support unit 200. As mentioned above, a plurality of grooves having different depths, widths, and volumes are provided at the top surface of the support unit 200, so that the amount of a heat transfer gas disposed between the substrate W and the support unit 200 may be adjusted. Thus, the temperature may be easily adjusted according to an area of the substrate W. For example, the heat transfer gas may include helium (He).

Referring to FIG. 1 again, the support plate 220 further includes a first electrode 223 and a heater 225, embedded in the support plate 220.

The first electrode 223 is electrically connected to a first power 223a. The power 223a includes DC power. A switch 223b is installed between the first electrode 223 and the first power 223a. The first electrode 223 may be electrically connected to a first power 223a by ON/OFF of the switch 223b. When the switch 223b is ON, DC current is applied to the first electrode 223. Electrostatic acts between the first electrode 223 and the substrate W by the current applied to the first electrode 223 and the substrate W is adsorbed to the support plate 220 by the electrostatic.

The heater 225 is disposed below the first electrode 223. The heater 225 is electrically connected to a second power 225a. The heater 225 generates heat by resisting the current applied from the second power 225a. The generated heat is transferred to the substrate W through the support plate 220. The substrate W is maintained at a predetermined temperature by the heat generated by the heater 225. The heater 225 includes a spiral coil.

The base plate 230 is disposed below the support plate 220. The bottom surface of the support plate 220 and the top surface of the base plate 230 may adhere to each other through a brazing process using a filler 235 as a medium. The base plate 230 may include a conductive material. For example, the base plate 230 may be provided with an aluminum material. The base plate 230 may include an electrode. The top surface of the base plate 230 may be stepped to allow a center heating area to be disposed higher than an edge heating area. The top surface center heating area of the base plate 230 has an area corresponding to the bottom of the substrate 220 and adheres to the bottom of the support plate 220. A circulation passage 231, a cooling member 232, and a second supply passage 233 are formed at the base plate 230.

The circulation passage 231 is provided as a path through which a heat transfer medium circulates. The circulation passage 231 may be formed with a spiral form in the base plate 230. Or, the circulation passage 231 may be disposed to allow passages having ring forms of different radii to have the same center. The circulation passages 231 may communicate with each other. The circulation passages 231 are formed at the same height.

The cooling member 232 cools the body. The cooling member 232 is provided as a path through which a cooling fluid circulates. The cooling member 232 may be formed with a spiral form in the base plate 230. Additionally, the cooling member 232 may be disposed to allow passages having ring forms of different radii to have the same center. The cooling members 232 may communicate with each other. The cooling member 232 may have a greater section area than the circulation passage 231. The cooling members 232 are formed at the same height. The cooling member 232 may be disposed below the circulation passage 231.

The second supply passage 233 extends from the first circulation passage 231 to the top and is provided at the top surface of the base plate 230. The second supply passage 233 is provided in correspondence to the number of the first supply passages 221 and connects the first circulation passage 231 and the first supply passage 221.

The circulation passage 231 is connected to a heat transfer medium storage unit 231a through a heat transfer medium supply line 231b. The heat transfer medium storage unit 231a stores a heat transfer medium. The heat transfer medium includes inert gas. According to an embodiment of the present invention, the heat transfer medium includes He gas. The He gas is supplied to the circulation passage 231 through the supply line 231b, sequentially passes through the second supply passage 233 and the first supply passage 221, and is supplied to the bottom of the substrate W. The He gas serves as a medium by which a heat transferred from plasma to the substrate W is transferred to the electrostatic chuck 210.

The cooling member 232 is connected to the cooling fluid storage unit 232a through the cooling fluid supply line 232c. The cooling fluid storage unit 232a stores a cooling fluid. A cooler 232b may be provided in the cooling fluid storage unit 232a. The cooler 232b cools a cooling fluid to a predetermined temperature. Unlike this, the cooler 232b may be installed on the cooling fluid supply line 232c. The cooling fluid supplied to the cooling member 232 through the cooling fluid supply line 232c cools the base plate 230 as circulating along the cooling member 232. As the base plate 230 is cooled and thus cools the support plate 220 and the substrate W together, the substrate W is maintained at a predetermined temperature.

The base plate 230 may include a metallic plate. For example, the entire base plate 230 may be provided with a metallic plate. The base plate 230 may be electrically connected to a third power 235a. The third power 235a may be provided as a high-frequency power generating high-frequency power. The high-frequency power may be provided as RF power. The base plate 230 receives a high-frequency power from the third power 235a. Due to this, the base plate 230 may function as an electrode.

A focus ring 240 is disposed at an edge area of the electrostatic chuck 210. The focus ring 240 has a ring form and is disposed along the circumference of the support plate 220. The top surface of the focus ring 240 may be stepped to allow the outer part 240a to be higher than the inner part 240b. The top surface inner part 240b of the focus ring 240 and the top surface of the support plate 220 may be positioned at the same height. The top surface inner part 240b of the focus ring 240 supports an edge area of the substrate W disposed at the outer side of the support plate 220. The outer part 240a of the focus ring 240 is provided to surround the edge area of the substrate W. The focus ring 240 controls an electromagnetic field thereby uniformly distributing the density of plasma in an entire area of the substrate W. Due to this, plasma is uniformly formed over an entire area of the substrate W, so that each area of the substrate W may be etched uniformly.

The lower cover 250 is disposed at the bottom end part of the support unit 200. The lower cover 250 is disposed spaced from the bottom surface of the chamber 100 to the top. A space having the top surface open is formed in the lower cover 250. The external radius of the lower cover 250 may have the same length as the external radius of the base plate 230. A lift pin module (not shown) moving the transferred substrate W from the external conveying member to the electrostatic chuck 210 may be disposed in an inner space of the lower cover 250. The bottom surface of the lower cover 250 may be provided with a metallic material.

The lower cover 250 has a connection member 253. The connection member 253 connects the outer surface of the lower cover 250 and the inner wall of the chamber 100. A plurality of connection members 253 are provided at the outer surface of the lower cover 250 at regular intervals. The connection member 253 supports the support unit 200 in the chamber 100. Additionally, as the connection member 253 is connected to the inner wall of the chamber 253, the lower cover 250 is electrically grounded. A first power line 223c connected to the first power 223a, a second power line 225c connected to the second power 225a, a third power line 235c connected to the third power 235a, a heat transfer medium supply line 231b connected to the heat transfer medium storage unit 231a, and a cooling fluid supply line 232c connected to the cooling fluid storage unit 232a extend into the lower cover 250 through an inner space of the connection member 253.

The plate 270 is disposed between the electrostatic chuck 210 and the lower cover 250. The plate 270 covers the top surface of the lower cover 250. The plate 270 is provided as a section area corresponding to the base plate 230. The plate 270 may include an insulator. The plate 270 electrically insulates the base plate 230 from the lower cover 250.

A plasma source generates plasma from a process gas. The plasma source may provide capacitively coupled plasma (CCP) or inductively coupled plasma (ICP).

Hereinafter, the case that a plasma source is provided as capacitively coupled plasma (CCP) in the substrate treating device 10 is described. Thus, the plasma source includes a shower head 300. Unlike this, the plasma source may be provided as inductively coupled plasma (ICP).

The shower head 300 is disposed above the support unit 200 in the chamber 100. The shower head 300 is disposed to face the support unit 200.

The shower head 300 includes a gas distribution plate 310 and a support part 330. The gas distribution plate 310 is spaced a predetermined distance from the top surface of the chamber 100 to the bottom. A predetermined space is formed between the gas distribution plate 310 and the top surface of the chamber 100. The gas distribution plate 310 may be provided in a plate form with a uniform thickness. The bottom surface of the gas distribution plate 310 may be polarized so as to prevent arc generation by plasma. The section of the gas distribution plate 310 may be provided to have the same form and section area as the support unit 200. The gas distribution plate 310 includes a plurality of injection holes 311. The injection hole 311 vertically penetrates the top and bottom surfaces of the gas distribution plate 310. The gas distribution plate 310 includes a metallic material. The gas distribution plate 310 may be electrically connected to the fourth power 351. The fourth power 351 may be provided as high-frequency power. Unlike this, the gas distribution plate 310 may be electrically grounded. The gas distribution plate 310 may be electrically connected to the fourth power 351 or grounded, thereby functioning as an electrode.

The support part 330 supports a side part of the gas distribution plate 310. The support part 330 has a top end connected to the top surface of the chamber 100 and a bottom end connected to a side part of the gas distribution plate 310. The support part 330 may include a non-metallic material.

The shower head 300 serves as an electrode as power is provided. The shower head 300 and the base plate 230 of the support unit 200 may serve as an upper electrode and a lower electrode, respectively. The upper electrode and the lower electrode may be disposed vertically parallel to each other in the chamber 100. One of the upper electrode and the lower electrode may apply high-frequency power and the other one may be grounded electrically. An electromagnetic field may be formed in a space between the both electrodes and a process gas supplied to this space may be excited to a plasma state. By using this plasma, a substrate treating process is performed.

For example, high-frequency power may be applied to the lower electrode and the upper electrode may be grounded electrically. Unlike this, high-frequency power may be applied to the both the upper electrode and the lower electrode. Due to this, an electromagnetic field occurs between the upper electrode and the lower electrode. The generated electromagnetic field excites a process gas provided to the inside of the chamber 100 to a plasma state.

The gas supply unit 400 supplies a process gas to the inside of the chamber 100. The gas supply unit 400 includes a gas supply nozzle 410 a gas supply line 420, and a gas storage unit 430. The gas supply nozzle 410 is installed at the top surface center part of the chamber 100. An injector is formed at the bottom of the gas supply nozzle 410. The injector supplies a process gas into the chamber 100. The gas supply line 420 connects the gas supply nozzle 410 and the gas storage unit 430. The gas supply line 420 supplies a process gas stored in the gas storage unit 430 to the gas supply nozzle 410. A valve 421 is installed at the gas supply line 420. The valve 421 opens/closes the gas supply line 420 and adjusts the flow rate of a process as supplied through the gas supply line 420.

A baffle unit 500 is disposed between the inner wall of the chamber 100 and the support unit 200. A baffle 510 is provided in an annular ring form. A plurality of through holes 511 are formed in the baffle 510. A process gas provided into the chamber 100 passes through the through holes 511 of the baffle 510 and is discharged to the discharge hole 102. The flow of a process gas may be controlled according to the form of the baffle 510 and the forms of the through holes 511.

Figure 4:
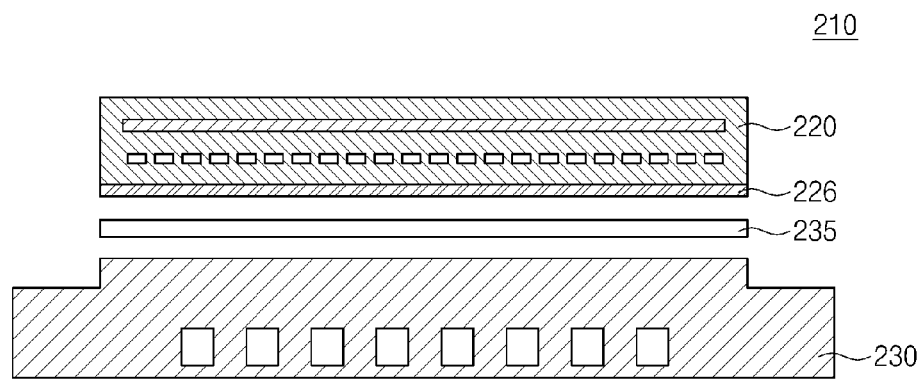
FIG. 4 is a schematic separation diagram illustrating components of a support unit of FIG. 1.
Figure 5:
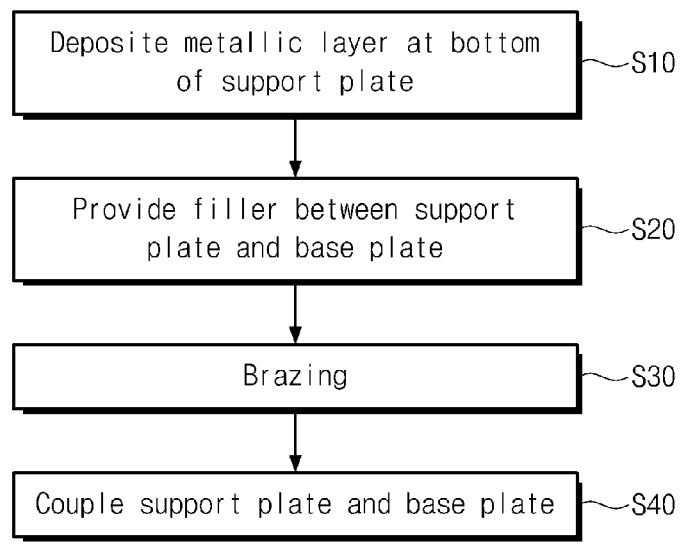
FIG. 5 is a flowchart illustrating a method of manufacturing a support unit.

Hereinafter, a method of manufacturing the support unit of FIG. 1 will be described. FIG. 4 is a schematic separation diagram illustrating components of the support unit of FIG. 1. FIG. 5 is a flowchart illustrating a method of manufacturing a support unit. For convenience of drawing, grooves, protrusions, projection parts, and supply passages at the top of the support plate 220 are omitted.

The electrostatic chuck 210 of a support unit includes a support plate 220, a base plate 230, and a bonding part. Herein, the bonding part is a bonding layer bonded through a brazing process using the filler 235 as a medium.

First, a metallic layer 226 is deposited at the bottom surface of the support plate 220 formed of a non-conductive material in operation S10. The metallic layer 226 may be deposited at the bottom surface of the support plate 220 through vacuum deposition or plating. The metallic layer 226 may be one of Ti, Ni, and Ag.

A filler 235 is provided between the support plate 220 and the base plate 230 formed of a conductive material in operation S20. The filler 235 may be provided with a metallic material. For example, the filler 235 may include AL. A brazing process is performed by using the filler 235 as a medium in operation S30. To briefly explain the brazing process, after the filler 235 is inserted between the support plate 220 and the base plate 230 to be bonded and then is heated to a temperature sufficient for melting a metal, as the melted filler 235 is cooled, a storing bonding part is formed.

The support plate 220 and the base plate 230 are coupled to each other through the brazing. By this, as the support plate 220 and the base plate 230 are coupled to each other, the electrostatic chuck 210 has a great heat resistance during a high temperature process.

For reference, the filler 235 may be provided with a metal having a lower melting point than the metallic layer 226 and the base plate 230 at the bottom of the support plate 220.

Moreover, in order to minimize a heat stress by a thermal expansion rate difference between a base plate and a support plate, the base plate may be provided with a conductive composite material obtained by mixing a conductive material and an added material. The added material may be a material that expands less in consideration of a thermal expansion rate difference between a conductive material and a material of a support plate. For example, the conductive material may include Ti or Al and the added material may include one of SiC, $Al_2O_3$, Si, graphite, and glass fiber. The conductive composite material may include the added material of 10% to 70%.

As mentioned above, as a base plate is manufactured with a conductive composite material, when the support plate 220 and the base plate 230 are coupled by brazing, a heat stress by a thermal expansion rate difference between the support plate 220 and the base plate 230 may be reduced. By reducing the heat stress due to a thermal expansion rate difference, a crack phenomenon and a bending phenomenon in the support plate 220 due to a thermal expansion difference may be prevented.

In the above embodiment, the case that the support plate 220 and the base plate 230 are coupled to each other through brazing is described. Unlike this, the support plate 220 and the base plate 230 are coupled to each other through different various methods. For example, an adhesive layer may be provided between the support plate 220 and the base plate 230.

Figure 6:
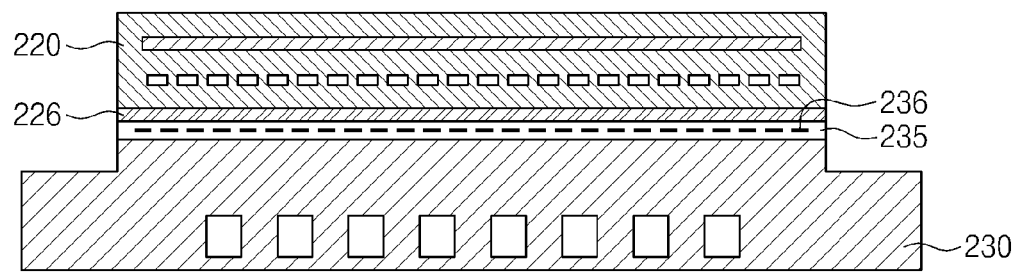
FIG. 6 is a view illustrating a modified embodiment of an electrostatic chuck.

FIG. 6 is a view illustrating a modified embodiment of an electrostatic chuck.

An electrostatic chuck 210a shown in FIG. 6 includes a support plate 220, a base plate 230, and a bonding part. Herein, the bonding part is an adhesive layer adhered through a brazing process using the filler 235 as a medium. The difference from the above electrostatic chuck is that a metal mesh 236 is inserted into the filler 235 so as to reduce the degree of expansion resulting from a thermal expansion rate difference. For example, the metal mesh 236 may have a porosity of 20% to 80%.

Although a bonding part may be provided with the metal mesh 236 inserted into the filler 235 in this embodiment, as another example, the filler 235 itself may be provided in a mesh form.

Figure 7:
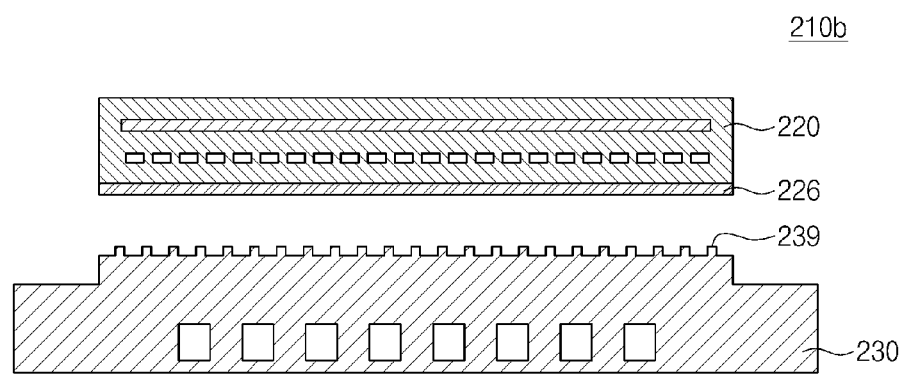
FIG. 7 is a view illustrating another modified embodiment of an electrostatic chuck.
Figure 8:
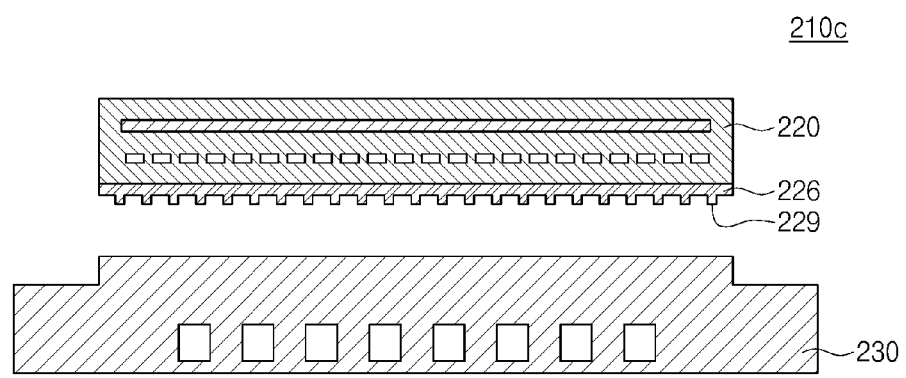
FIG. 8 is a view illustrating another modified embodiment of an electrostatic chuck.

FIGS. 7 and 8 are views illustrating a modified embodiment of an electrostatic chuck.

Electrostatic chucks 210b and 210c shown in FIGS. 7 and 8, without a filler as a medium, a metallic layer 226 and a base plate 230 at the bottom of a support plate 220 may be coupled by brazing. Uneven parts 239 and 229 may be provided to the metallic layer 226 and the base plate 230 so as to minimize a stress due to thermal expansion. The uneven parts 239 and 229 may be formed at the top surface of the base plate 230 or the bottom of the metallic layer 226 as shown in FIGS. 7 and 8. For example, the uneven parts 239,229 may be provided in a mesh form or an embossing form.

According to an embodiment of the present invention, a support unit having a strong thermal durability may be provided.

According to an embodiment of the present invention, by minimizing a heat stress due to a thermal expansion rate difference between a support plate and a base plate, a crack phenomenon and a bending phenomenon in the support plate may be prevented.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of manufacturing a support unit that supports a substrate, the method comprising:
   providing a support plate formed of a non-conductive material and supporting a substrate;
   providing a base plate disposed below the support plate and formed of a material including a conductive material; and
   depositing a metallic layer at a bottom of the support plate and coupling the metallic layer and the base plate through brazing,
   wherein a plurality of protrusions are provided at a bottom surface of the metallic layer or a top surface of the base plate.

2. The method of claim 1, further comprising providing a filler of a metallic material between the support plate and the base plate to couple the support plate and the base plate by using the filler as a medium.

3. The method of claim 1, wherein the base plate is formed of a conductive composite material obtained by mixing the conductive material and an added material to minimize a heat stress due to a thermal expansion rate difference between the base plate and the support plate.

4. The method of claim 3, wherein the conductive material comprises Ti or Al and the added material comprises one of SiC, $Al_2O_3$, Si, graphite, and glass fiber.

5. The method of claim 3, wherein a thermal expansion rate difference of the added material from a thermal expansion rate of the conductive material of the base plate or a material of the support plate is less than a thermal expansion rate difference between the conductive material of the base plate and the material of the support plate.

6. The method of claim 3, wherein the conductive composite material comprises the added material of 10% to 70%.

7. The method of claim 1, wherein the metallic layer is deposited to the bottom of the support plate through vacuum deposition or plating.

8. The method of claim 1, wherein the plurality of protrusions are configured to minimize a stress due to a thermal expansion rate difference between the bottom surface of the metallic layer and a top surface of the base plate.

9. The method of claim 7, wherein the metallic layer comprises one of Ti, Ni, and Ag.

10. The method of claim 2, wherein the filler comprises AL.

11. The method of claim 2, wherein a metallic mesh buffering a thermal expansion at a high temperature is provided in the filler.

12. The method of claim 11, wherein the metallic mesh has a porosity of 20% to 80%.

13. A substrate support unit comprising:
    a support plate including an electrode that adsorbs a substrate by electrostatic force and having a bottom surface where a metallic layer is deposited; and
    a base plate disposed below the support plate, connected to a high frequency power, and coupled to the metallic layer through brazing,
    wherein a plurality of protrusions are provided at the bottom surface of the metallic layer or a top surface of the base plate.

14. The substrate support unit of claim 13, wherein an even part is provided to minimize a stress due to a thermal expansion of a bottom of the metallic layer, a top surface of the base plate, or a form of a metallic deposition layer and an uneven part is provided in a mesh form or an embossing form.

15. The substrate support unit of claim 13, wherein the base plate comprises a conductive composite material obtained by adding one of Sic, $Al_2O_3$, Si, graphite, and glass fiber to a conductive material to minimize a heat stress due to a thermal expansion rate difference between the base plate and the support plate.

16. The substrate support unit of claim 13, further comprising a bonding part disposed between the metallic layer and the base plate and fixing the metallic layer and the base plate by using a filler as a medium.

17. The substrate support unit of claim 16, wherein the bonding part further comprises a metallic mesh therein.

18. A substrate treating device comprising:
    a chamber having a treating space therein;
    a support unit disposed in the chamber and supporting a substrate;
    a gas supply unit supplying a process gas to the treating space; and
    a plasma source generating plasma from the process gas,
    wherein the support unit comprises:
      a support plate including an electrode that adsorbs a substrate by electrostatic force and having a bottom surface where a metallic layer is deposited; and
      a base plate provided below the support plate and connected to a high frequency power; and
      a metallic filler disposed between the support plate and the base plate and bonding the support plate and the base plate by brazing,
      wherein a plurality of protrusions are provided at a bottom surface of the metallic layer or a top surface of the base plate.

19. The substrate treating device of claim 18, wherein the base plate comprises a conductive composite material obtained by adding one of SiC, $Al_2O_3$, Si, graphite, and glass fiber to a conductive material to minimize a heat stress due to a thermal expansion rate difference between the base plate and the support plate.

20. The substrate treating device of claim 18, wherein the support unit further includes a filler between the support plate and the base plate.

21. The substrate treating device of claim 20, wherein the filler is provided in a metallic mesh form.

* * * * *